United States Patent [19]
Waterman et al.

[11] 4,047,239
[45] Sept. 6, 1977

[54] STATIONARY INDUCTION APPARATUS HAVING MEANS TO MONITOR INSULATION DRYNESS

[75] Inventors: Michael W. Waterman, Milwaukee; Samuel L. Foster, Eagle, both of Wis.

[73] Assignee: Allis-Chalmers Corporation, Milwaukee, Wis.

[21] Appl. No.: 666,475

[22] Filed: Mar. 12, 1976

Related U.S. Application Data

[62] Division of Ser. No. 521,743, Nov. 7, 1974, Pat. No. 3,961,246.

[51] Int. Cl.² .................. G01R 27/26; G01R 31/12
[52] U.S. Cl. .................................. 361/270; 324/54
[58] Field of Search .............. 317/157.62, 256, 246; 324/54, 55, 61 R, 61 P; 361/270

[56] References Cited

U.S. PATENT DOCUMENTS

| 1,371,378 | 3/1921 | Klauber | 324/54 |
| 2,126,915 | 8/1938 | Norton | 317/256 X |

Primary Examiner—R. N. Envall, Jr.
Attorney, Agent, or Firm—Robert C. Jones

[57] ABSTRACT

Model insulation structure representative of the most critical insulation in a stationary induction apparatus is placed in the bottom of the oil tank and is provided with spaced conductive electrodes forming a capacitor having sufficient capacitance for measuring the dissipation or power factor of the insulation.

6 Claims, 4 Drawing Figures

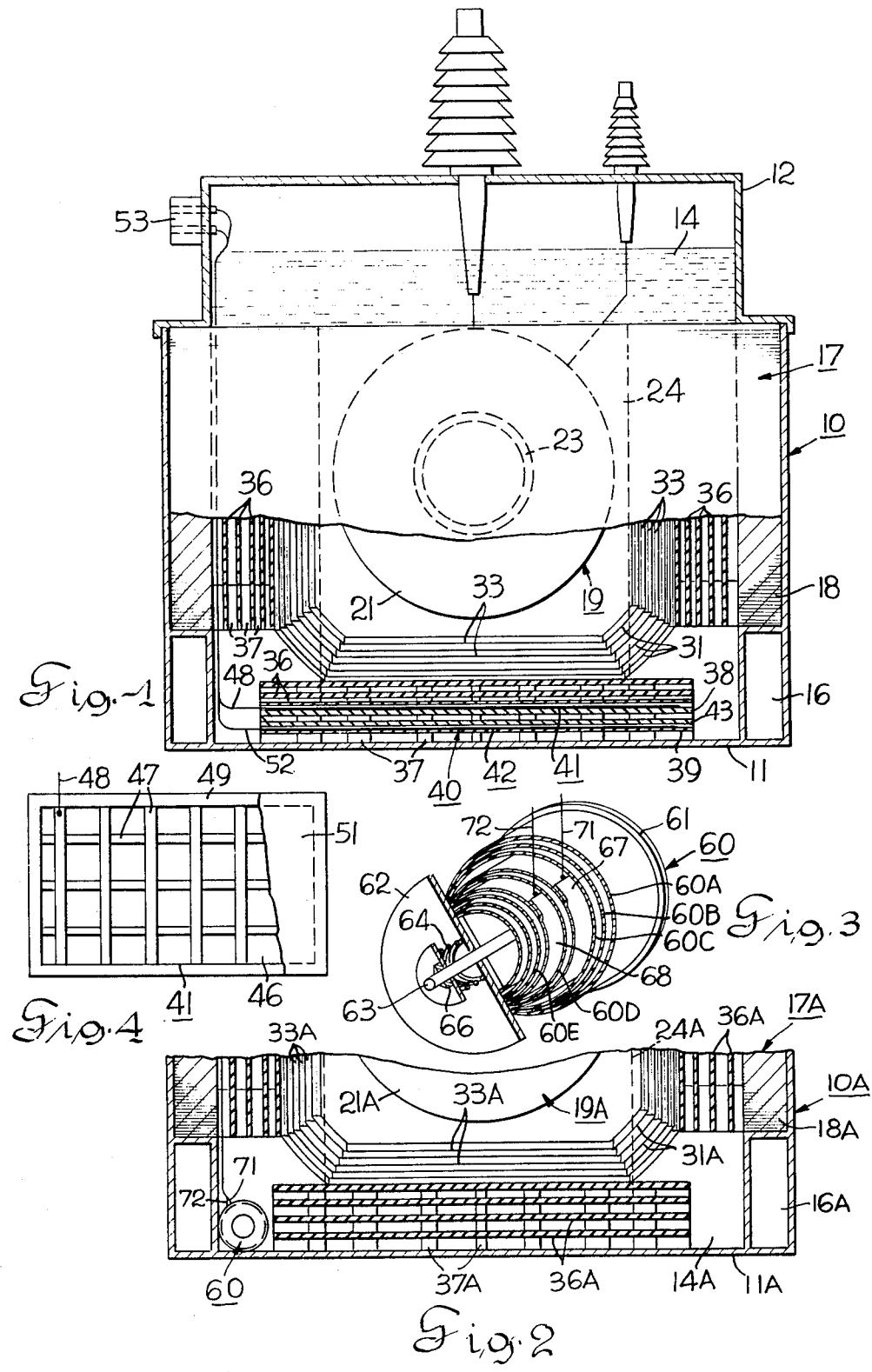

STATIONARY INDUCTION APPARATUS HAVING MEANS TO MONITOR INSULATION DRYNESS

This is a division of application Ser. No. 521,743 filed Nov. 7, 1974 now U.S. Pat. No. 3,961,246.

BACKGROUND OF THE INVENTION

Direct measurement of winding insulation does not provide a good indication of the moisture content of insulation in stationary induction apparatus, particularly those types immersed in oil for cooling purposes, and more particularly, with oil immersed induction apparatus with reduced insulation at the neutral. This is true because if the neutral insulation space is small, the stationary induction apparatus will have a large capacitance from winding to tank which substantially affects the determination of the dissipation or power factor. Thus, the condition of the insulation at the high voltage end of the winding, which is the important factor, will be masked by the large neutral end capacitance. This is especially true if high dissipation or power factor materials such as impregnated and laminated paper are used in the mechanical structure. In this arrangement when making field measurements, the power system must be disconnected from the induction apparatus because of the parallel capacitance of lightning arrestors, insulators, etc.

Another method to determine moisture content of stationary induction apparatus insulation is the measurement of the gas space dew point. The gas space dew point method to determine the moisture content requires a careful technique. Usually, electronic probes are used with the dew point method and these probes must be accurately calibrated and are also easily damaged. In addition, a long period of constant ambient and operating conditions is required to insure that there is equilibrium between the moisture content of the insulation, oil and gas space.

Still another method that is used to determine the moisture content of stationary induction apparatus insulation is the laboratory analysis of the moisture content of the oil. However, with this method, the sampling technique as well as the analysis is critical to a point that field personnel cannot normally perform the sampling nor the analyzing.

In addition, all of the above methods of determining the moisture content in stationary induction apparatus do not indicate the localized concentration of moisture in the insulation which is usually experienced in the lower or bottom portion of the oil tank.

SUMMARY OF THE INVENTION

The present invention is an improved method and means for determining the insulation dryness of high voltage stationary induction apparatus such as shunt reactors and transformers. With the present invention, representative insulating structure having electrodes spaced by at least one layer of the insulation to form a capacitor is placed in the bottom of the oil tank and leads are connected and brought out to the exterior of the tank for measuring the dissipation or power factor of the insulation. The model insulation is arranged to be representative of the most critical insulation in the induction apparatus and provide sufficient capacitance for accurate measurements.

It is a general object of the present invention to provide an improved method for determining the insulation dryness of high voltage stationary induction apparatus.

Another object of the present invention is to provide a method and means for measuring the dissipation or power factor of paper insulation at the high voltage end of the windings of a stationary induction apparatus which will not be masked by the large neutral end capacitance.

Still another object of the present invention is to provide a method and means for measuring the dissipation or power factor of the insulation of a stationary induction apparatus without the necessity of disconnecting the induction apparatus from the power system.

Yet another object of the present invention is to provide a method and means for measuring the dissipation or power factor of the insulation of stationary induction apparatus which provides sufficient capacitance for accurate measurement.

A still further object of the present invention is to provide a method and means for determining the moisture content of the insulation of a stationary induction apparatus.

DESCRIPTION OF THE DRAWINGS

FIG. 1 is a view in elevation of a single phase stationary induction apparatus in which the invention has been incorporated, with parts broken away to show some of the insulation thereof;

FIG. 2 is a fragmentary view in section of the lower portion of a stationary induction apparatus showing a modification of the invention of FIG. 1;

FIG. 3 is an enlarged isometric view of the moisture sensing means shown in FIG. 2; and, FIG. 4 is a plan view of an electrode showing the collectors on the carbon paper and the backing paper to reinforce the electrodes.

DESCRIPTION OF THE INVENTION

Referring to the drawings, a shunt reactor 10 embodying the invention may be used in each phase of a multiphase extra high voltage electrical power transmission system. The reactor 10 includes a tank 11 having a cover 12 and filled with a dielectric cooling and insulating oil 14. Tank 11 is provided with an oil circulating manifold 16 which extends around the entire side walls of the tank 11. The manifold 16 may also serve to support a rectangular magnetic yoke, or core 17 having magnetic steel laminations 18 disposed in horizontal planes and parallel to the axis of a cylindrical reactor coil 19 positioned within the window of the core 17 so that the axial ends of the coil 19 are closely adjacent the end portions of the magnetic yoke.

The coil 19 has a nonmagnetic core and comprises a plurality of electrically connected but axially spaced coaxial pancake windings 21, one of which is shown. A typical shunt reactor coil 19 may have approximately 80 pancake windings 21. The pancake windings 21 are supported on a tube 23 of an insulating material having a high dielectric strength. The ends of supporting tube 23 extend beyond the pancake windings 21 and into suitable openings provided in insulating headboards 24, one of which is shown.

Planar insulating washers 21 are disposed between the pancake windings 21 which may be circular and/or rectangular and herein depicted as being rectangular having clipped corners. For a more detailed description of the construction and arrangement of the internal structure, reference may be had to U.S. Pat. No. 3,362,001 assigned to the same assignee as the subject application. The washers 31 are maintained apart by means of radially extending spacer sticks (not shown) to provide cooling ducts between the pancake windings 21. As depicted, the washers 31 are of progressively greater radial dimensions as the washers progress from the center of the coil outwardly in both directions. In FIG. 1, the washers 31 are shown as those associated with the rearward half of the coil, and the forward half would present the same appearance but in the opposite relationship. The insulating washers 31 each overlap the bent-over ends of vertical insulating wrapper sheets 33 disposed between the coil 19 and the core side portions to provide high dielectric strength therebetween. The wrapper sheets 33 from the outermost one progressively decrease in length in a radially inward direction, thereby grading the insulation to provide maximum insulation thickness between the magnetic core 17 and the pancake windings 21 at the point of highest potential relative to ground and progressively decreasing the insulation thickness as the potential of the pancake windings relative to ground decreases. Also provided are a plurality of relatively heavy impregnated laminated paper insulators 36 which are disposed between the magnetic core 19 and the pancake windings 21 and are also located on the bottom to provide an insulating bottom barrier. The laminated insulators 36 are separated by maple blocks 37 to provide passages or ducts for the circulation of the oil.

As previously mentioned, the entire shunt reactor 10 is immersed in insulating and cooling oil 14 contained within the tank 11. However, the assembled reactor 10 is subject to a dryout process prior to deaerated insulating and cooling oil 14 being pumped into the tank 11 to reduce the moisture content of the insulation for reducing the power factor to acceptable values, generally below 1%. This power factor value is carefully recorded and is provided with the records relating to the particular stationary induction apparatus such as the reactor 10. However, the chemical and physical properties of the oil used in the reactor is subject to gradual change during use. Thus, during the aging process the oil is affected by temperature, moisture and other materials with which the oil is in contact. Since oil tends to permit water which enters the reactor to separate and precipitate to the bottom of the tank, the integrity of the insulation dryness is affected.

To provide an improved method of determining the insulation dryness without the necessity of disconnecting the reactor from the power system, a moisture detector 40 is provided. As shown in FIG. 1, the moisture detector 40 is an integral part of the main insulation of the reactor 10. The moisture detector 40 indicates the state of dryness of the reactor insulation by means of power factor measurements. Such measurements may be taken easily and quickly and provide data which are more meaningful than tests made at the line terminals. To this end, planar conductive electrodes 41 and 42, such as metal foil for carbon paper, are laid and affixed to the laminated insulators 36 and preferably to representative insulators 38 and 39 which are separated from each other by at least one intervening insulator 43 to form a capacitor integral with the reactor insulation. In this arrangement, the electrodes 41 and 42 are placed in the bottom of the tank 11 where the precipitated water collects. With this arrangement and location, the electrodes are not sensitive to external stray magnetic or electric fields which are usually present. This is true because with the electrodes 41 and 42 located in the bottom of the tank 11 they are shielded from such fields.

In FIG. 4, the electrode 41 is shown in detail and its construction and arrangement is duplicated for the electrode 42. The electrode 41 comprises a sheet of carbon paper 46 having an area sufficiently large enough to provide good capacitance, preferably of 1000 picofarads. This will insure that the measurements will be representative. If the capacitance of the electrode is less than 500 picofarads, stray capacitance could affect the measurements taken.

The sheet carbon paper 46 has a preferred relative resistivity of 100 ohms per square centimeter so that the sheet carbon paper is a good conductor to handle the few milliamperes of the standard bridge measuring apparatus current. To collect the current from the sheet carbon paper electrode, a grid structure 47 of copper material is intimately secured to the sheet carbon paper electrode. A lead 48 is electrically connected to the collector grid 47. A kraft paper backing 49 serves as a reinforcing back cover, and a similar reinforcing top cover 51 of kraft paper is provided for the top cover of the electrode. The top and back covers 49 and 51 are in themselves not a part of the electrode but are provided to facilitate the handling of the electrode since the sheet carbon paper is relatively thin and ruptures easily. The electrode 42 is similar to the electrode 41 and has a lead 51 electrically connected to its associated collector grid. Leads 48 and 52 are brought out through insulated bushings to a terminal box 53 located on the upper portion of the tank on a side surface thereof.

With the arrangement described, it is only necessary to de-energize the reactor prior to making the tests. With the reactor de-energized, the protective ground connectors (not shown) from either the lead 48 or 52 is removed. Low power factor two-terminal measuring instruments, such as those normally used for transformers and bushings, including the 110 volt bridges, are suitable for making measurements and are connected to leads 48 and 52. One such standard power factor measuring apparatus is manufactured by the Doble Company. Measurements are made from lead 48 with lead 52 grounded. The dissipation or power factor value obtained is compared to corresponding data made at the factory and contained in the test report which accompanies each rector. Any sharp differences or adverse trends in the data obtained in the test from the data supplied from the factory will indicate the state of dryness of the insulation. This test measures the insulation dryness between the electrodes 41 and 42 and is usually the test that is made on a frequent period base.

However, if it should be desired to take a measurement of insulation dryness in other portions of the reactor device, other tests are capable of being made using three-terminal instruments. All tests capable of being made are listed in the following table:

| Test No. | Line On | Ground On | Guard On | Insulation Tested |
|---|---|---|---|---|
| 1 | 41 | 42 | Winding | 41 to 42 |
| 2 | 42 | Winding | 41 | 42 to Ground |
| 3 | 41 | Winding | 42 | 41 to Winding |
| 4 | Winding | 42 | 41 | Winding to Ground |

As previously mentioned, with electrode 41, which is nearest to the windings 21 connected to the high voltage line of the standard measuring apparatus, and with the electrode 42, which is furthest from the windings 21 connected to the ground line of the measuring apparatus, and the windings connected to the guard circuit of the measuring apparatus to eliminate the windings from the measurement procedure, a dissipation or power factor value indicating the relative dryness of the insulation between the two electrodes is measured.

In test No. 2, electrode 41, which is nearest to the windings 21, is connected to the guard circuit of the measuring apparatus, thereby removing it from the test. Under this condition the power factor value obtained indicates the relative dryness of the insulation between the electrode 42 and the bottom of the tank 11.

In test No. 3, the electrode 41, nearest the windings 21, is connected to the high voltage line of the measuring apparatus; the windings 21 are connected to the measuring apparatus ground line; and the electrode 42 furthest from the windings 21 is connected to the measuring apparatus guard circuit to remove this electrode from the test measurement. With this condition obtained, the power factor value obtained indicates the relative dryness of the insulation between the electrode 41 and the windings 21.

In test No. 4, the windings 21 are connected to the high voltage line of the standard measuring apparatus; the electrode 42 is connected to the ground line of the measuring apparatus; and the electrode 41 is connected to the guard circuit to remove it from the test measurement. With this condition obtained, the dissipation or power factor value obtained indicates the relative dryness of the insulation to the sides of the reactor or between the windings 21 and ground.

In FIG. 2, a modified arrangement of the moisture detector is shown. The moisture detector 60 is bodily disposed in the lower bottom corner of the tank 11A and, thus, is located in the area of the high moisture accumulation. The detector 60 comprises a plurality of concentrically arranged insulator tubes 60 maintained in concentric spaced apart relationship by laminated insulator wood discs 61 and 62. A rod 63 coaxial with and extending through the detector receives a spring 64 and an adjusting nut 66. Thus, by adjusting the nut 66, tension against the spring 64 may be applied to hold the tube insulators 60 in concentric spaced apart relationship. A first tubular electrode 67 of cylindrical copper sheet is interposed in spaced apart relationship between the insulator tubes 60C and 60D. Another tubular electrode 68 is interposed in spaced apart relationship between insulator tubes 60D and 60E. Thus, the electrodes 67 and 68 are separated by the insulator tube 60D. The electrodes 67 and 68 are provided with leads 71 and 72, respectively, which are connected to a terminal box (not shown) similar to the box 53 in FIG. 1. The insulator tubes 60 are of an insulation material which is representative of the insulation utilized within the reactor 10A. The detector 60 makes it possible to retroequip reactors that did not have a moisture detector as original equipment.

The embodiments of the invention in which an exclusive property or privilege is claimed are defined as follows:

1. A shunt reactor comprising, in combination:
   a tank;
   insulating oil within said tank;
   a shunt reactor coil and yoke assembly including insulation means at the sides and bottom thereof, said coil and yoke assembly being immersed in said oil within said tank;
   a pair of electrodes at the bottom of said coil and yoke assembly, said pair of electrodes being spaced apart by at least one layer of insulation which is representative of the insulation utilized with said shunt reactor coil and yoke assembly; and,
   a conductor lead connected to each electrode and having their terminal ends exteriorly of said tank.

2. A shunt reactor according to claim 1 wherein said pair of electrodes are each constructed of a sheet of carbon paper having current collecting means to which the conductor leads are electrically secured.

3. A shunt reactor according to claim 2 wherein said pair of electrodes each have capacitance between 500 to 1000 picofarads.

4. A shunt reactor according to claim 2 wherein said sheet of carbon paper of each of said electrodes have a relative resistivity of 1000 ohms per square centimeter.

5. In an insulation dryness detector for an induction apparatus that is immersed in oil contained in a tank, said detector being adapted to be immersed in the oil in said tank independently of said induction apparatus;
   a cylinder body comprising a plurality of concentrically arranged insulator tubes of insulating material representative of the insulation of the induction apparatus maintained in spaced apart relationship;
   a first cylindrical electrode interposed in spaced apart relationship between two adjacent insulator tubes;
   a second cylindrical electrode interposed in spaced apart relationship between two adjacent insulator tubes, one of said cylindrical tubes being associated with the other of said electrodes; and,
   conductor leads connected to each electrode and having their terminal ends exteriorly of the tank.

6. An insulation dryness detector according to claim 5 wherein said detector body is immersed in the oil contained in said tank in a region of high moisture potential.

* * * * *